(12) United States Patent
Sywyk et al.

(10) Patent No.: US 6,240,000 B1
(45) Date of Patent: May 29, 2001

(54) CONTENT ADDRESSABLE MEMORY WITH REDUCED TRANSIENT CURRENT

(75) Inventors: Stefan P. Sywyk, San Jose; Eric Voelkel, Ben Lomond, both of CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/376,397

(22) Filed: Aug. 18, 1999

(51) Int. Cl.$^7$ .................................................. G11C 15/00
(52) U.S. Cl. ............... 365/49; 365/189.05; 365/189.07; 365/194
(58) Field of Search ................... 365/49, 189.02, 365/189.07, 205, 230.03, 230.08, 233, 189.05, 194

(56) References Cited

U.S. PATENT DOCUMENTS

| | | |
|---|---|---|
| 4,996,666 | 2/1991 | Duluk, Jr. . |
| 5,010,516 | 4/1991 | Oates . |
| 5,440,715 | 8/1995 | Wyland . |
| 5,448,733 * | 9/1995 | Satoh et al. ........................... 395/600 |
| 5,517,441 | 5/1996 | Dietz et al. . |
| 5,602,764 * | 2/1997 | Eskandari-Gharnin et al. ............................. 364/715.09 |
| 5,859,791 * | 1/1999 | Schultz et al. ......................... 365/49 |
| 5,870,324 * | 2/1999 | Helwig et al. ......................... 365/49 |
| 5,893,137 | 4/1999 | Parks et al. . |
| 5,946,704 | 8/1999 | Yoneda et al. . |

* cited by examiner

Primary Examiner—David Nelms
Assistant Examiner—Gene N. Auduong
(74) Attorney, Agent, or Firm—Bradley T. Sako

(57) ABSTRACT

According to one embodiment a content addressable memory (CAM) (100) can segment comparand values and data values into portions. Comparand value portions are compared with corresponding data value portions in sequential compare operations. Sequential compare operations can distribute current peaks over two or more compare operations, thereby reducing peak current transients.

19 Claims, 10 Drawing Sheets

CONTENT ADDRESSABLE MEMORY WITH REDUCED TRANSIENT CURRENT

TECHNICAL FIELD

The present invention relates generally to content addressable memories (CAMs) and more particularly to approaches to reducing current transients in a CAM.

BACKGROUND OF THE INVENTION

Due to the increased prevalence of information networks, including the Internet, content addressable memories (CAMs) continue to proliferate. CAMs, also referred to as "associative memories," can provide rapid matching functions that are often needed in routers and network switches to process network packets. As just one example, a router can use a matching function to match the destination of an incoming packet with a "forwarding" table. The forwarding table can provide "nexthop" information that can allow the incoming packet to be transmitted to its final destination, or to another node on the way to its final destination. Of course, CAMs can also be used for applications other than network hardware.

A typical CAM can store a number of data values in a CAM cell array. In a compare (i.e., match) operation, the data values can be compared to a comparand value (also referred to as a "search key"). A data value that matches the comparand value can result in the generations of a match indication.

In many CAMs, match indications for data values are provided by conductive match lines. In some arrangements, the match lines can be precharged to a predetermined voltage prior to a compare operation. Subsequently, when a compare operation takes place, the match line(s) corresponding to a mismatch between a comparand value and a data value can be discharged (or charged) to a different voltage level. The different voltage level can indicate a match condition. Accordingly, as multiple match lines are charged and discharged, current is consumed by a CAM. Current consumption can be considerable for larger density CAMs. For example, a 64-bit×16K CAM can precharge over 16,000 match lines at essentially the same time.

Other structures within a CAM can also consume current. As just one example, in addition to match lines, a CAM can include comparand lines that can carry the comparand value bits to a CAM cell array. In some arrangements, the comparand lines are complementary comparand lines that are first precharged/equalized to a precharge potential or predischarged to a predischarge potential, usually zero volts. The comparand values can then be driven with the comparand value. Thus, the operation of comparand lines can also consume current.

As CAM sizes increase, the size of match lines and/or comparand lines can also increase. Thus, a compare operation in a conventional CAM can result in substantial current draws on a CAM power supply (current transient peaks). Such current draws can result in a voltage drop on the CAM power supply (a temporary "collapse" in the power supply voltage). A drop in a CAM power supply may have a variety of adverse effects on the operation of the CAM. As just a two examples, as a power supply voltage drops, various circuit nodes are slower to charge and/or device impedance can increase. Thus, the operation of the CAM can slow down until the CAM power supply returns to its previous level ("recovers"). Because CAM memory cells can include volatile storage devices, a drop in the CAM power supply voltage can result in the corruption of stored data. In one particular example, static volatile storage devices, such as latches and/or register circuits, can have stored logic values reversed ("flipped") if a power supply dip is sufficiently severe.

It would be desirable to arrive at some way of operating a CAM that can reduce current transient peaks.

CAM devices can be synchronous and/or asynchronous. A synchronous CAM can perform matching functions on applied comparand values according to a periodic timing signal (such as a system clock, as one example). An asynchronous CAM can perform matching functions on applied comparand value according a non-periodic timing signal (such as an applied comparand value, as just one example).

It is often desirable for synchronous CAMs to operate according to particular timing specifications. As just one example, it is desirable to have a CAM that can receive a comparand value on a certain clock edge, and then provide a compare result a predetermined number of clock cycles later. Such configurations can allow comparand values to be applied every clock cycle, resulting in the generation of compare results every clock cycle.

CAMs can include "binary" CAMs in which a multi-bit comparand value must match with every bit of a data value to generate a match indication. CAMs can also include "ternary" CAMs in which multi-bit comparand values can be compared with "maskable" data values. A maskable data value can have one or more bits that can be masked from the compare operation. A masked bit will not generate a mismatch indication even if the masked data value bit is different than the corresponding comparand value bit. Thus, a match indication can include a binary or a ternary match indication, according to the type of CAM.

CAMs can receive comparand and/or data values by way of data buses. Systems that utilize electronic devices like CAMs, can often include components that process data values having bit widths that are larger than available bus sizes. Accordingly, it would be desirable to provide a CAM that can receive comparand values by way of a bus having a width smaller than a comparand value.

A conventional CAM will now be described to better understand the various disclosed embodiments of the present invention.

Referring now to FIG. 12, one example of a conventional CAM is set forth in a block schematic diagram. The conventional CAM is designated by the general reference character 1200, and is shown to include a number of CAM cells 1202, coupled to match lines (MATCH0 to MATCHz) and complementary comparand value lines 1204.

In a compare operation, initially, match lines (MATCH0 to MATCHz) can be precharged to a first potential (a logic high, for example) by precharge circuits 1206. Precharge circuits 1206 can be activated by a match line precharge signal MATCH_PRECH. Such an operation can consume a relatively large amount of current.

In addition, the complementary comparand value lines 1204 can be predischarged and/or equalized by predischarge/equalization circuits 1208. Predischarge/equalization circuits 1208 can be activated by a compare line predischarge signal CMP_PREDISCH. This operation can also consume some current.

Once the match lines (MATCH0 to MATCHZ) are precharged and the complementary comparand value lines 1204 are predischarged and/or equalized, a comparand value can be applied by way of complementary comparand value lines 1204. In the event there is no match (a mismatch condition)

between a data value stored in a row of CAM cells 1202 and the applied comparand value, the corresponding match line (MATCH0 to MATCHz) can be discharged. In the event there is a match condition between a data value stored in a row of CAM cells 1202 and the applied comparand value, the corresponding match line (MATCH0 to MATCHZ) can remain precharged, and thereby provide a match indication.

SUMMARY OF THE INVENTION

According to disclosed embodiments, a content addressable memory (CAM) can distribute a single compare operation into a number of sequential compare operations, thereby reducing the magnitude of current transients.

According to one aspect of the embodiments, the CAM can operate in synchronism with a periodic clock signal, and the compare operations can be distributed over a clock signal period.

According to another aspect of the embodiments, a CAM can include a segmented mode of operation in which a comparand value is divided into comparand portions. Data values stored by the CAM are divided into corresponding data value portions. Sequential compare operations can compare comparand portions to corresponding data value portions.

According to another aspect of the embodiments, a CAM can include a segmented mode of operation. If a compare operation indicates a mismatch between a comparand portion and data value portion, the mismatch indication can be used to disable corresponding sequential compare operations.

According to another aspect of the embodiments, a CAM can include a non-segmented mode of operation in which a "whole" (non-segmented) comparand value can be compared to data values within one circuit block in a first compare operation, and then compared to data values within another circuit block in a subsequent compare operation.

According to another aspect of the embodiments, compare indications from a first compare operation can be stored, and then combined with compare indications from one or more subsequent compare operations.

According to another aspect of the embodiments, a CAM can be selectable between a non-segmented mode and one or more segmented modes. In a non-segmented mode, output values can be provided that represent match (or mismatch) indications between a comparand value and data values. In a segmented mode, output values can be provided that represent match (or mismatch) indications between two or more comparand value portions and corresponding data value portions.

According to one aspect of the embodiments, a CAM can be selectable between a non-segmented mode and at least one segmented mode. In a non-segmented mode, a comparand of size x can be compared to data values of size x. In a segmented mode of operation, comparand values of size n*x can be compared with data values of size n*x, where n is an integer greater than one. Such a comparison can include "n" sequential compare operations.

BRIEF DESCRIPTION OF THE DRAWINGS

FIG. 11B is a timing diagram illustrating the operation of the circuit of FIG. 11A.

DETAILED DESCRIPTION OF THE EMBODIMENTS

According to one embodiment of the present invention a content addressable memory (CAM) can distribute the current transient of a match operation, by dividing a match operation into one or more segments executed at different points in time.

In general, a CAM according to a first embodiment can store a number of data values that are to be compared with a comparand value. The data values can be divided into two or more portions, with each data value portion being stored in a particular circuit block. In a comparison operation, a comparand value can be divided into a number of portions. The portions of the comparand value can be applied sequentially to the circuit blocks to generate partial match values. The partial match values can be combined to determine a complete match indication between a "whole" (i.e., non-segmented) comparand value and whole data values.

Figure 1:
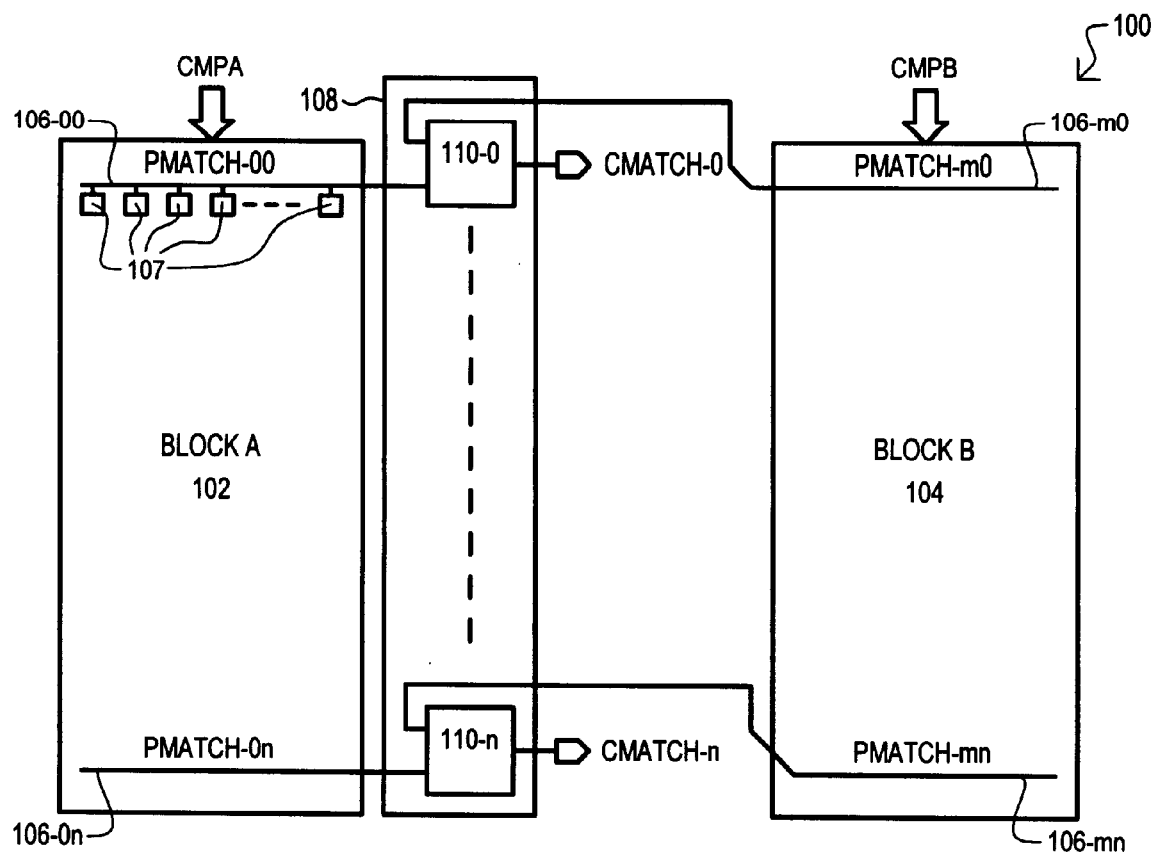
FIG. 1 is a block schematic diagram of content addressable memory arrangement according to a first embodiment.

Referring now to FIG. 1, a CAM according to a first embodiment is set forth in a block diagram. The first embodiment is designated by the general reference character 100, and is shown to include a first circuit block 102 and another circuit block 104. In the first embodiment 100, the first circuit block 102 can include a number of first match line sets 106-00 to 106-0n. Each first match line set (106-00 to 106-0n) can provide one or more match indications between a partial data value stored within the first circuit block 102 and a partial comparand value (CMPA). The other circuit block 104 can include a number of other match line sets 106-m0 to 106-mn, that can provide one or more match indications between other partial data values and another partial comparand value (CMPB).

A number of CAM cells 107 are shown coupled to match line set 106-00. In some particular configurations, a row of such CAM cells 107 can be coupled to each match line of a match line set (106-00 to 106-mn).

In one particular arrangement, the first embodiment 100 can compare a 128-bit comparand value with a number of 128-bit data values. Each first match line set (106-00 to 106-0n) can each include one match line that provides one partial match indication. The partial match indication can indicate a match between a 64-bit most significant portion of a 128-bit comparand value and a number of 64-bit most significant partial data values. Second match line sets (106-m0 to 106-mn) can each include one match line that provides a match indication between a 64-bit least significant portion of a 128-bit comparand value, and a number of 64-bit least significant data value portions.

The first embodiment 100 is shown to further include a combining circuit block 108. A combining circuit block 108 can logically combine the partial match indications from the first 102 and other circuit blocks 104 and generate complete match output indications (CMATCH-0 to CMATCH-n).

In the arrangement of FIG. 1, the combining circuit block 108 can include a number of combining circuits 110-0 to 110-n, each of which can combine one partial match indication from the first circuit block 102 with a corresponding partial match indication from another circuit block 104. Two combining circuits 110-0 and 110-n are shown in particular in FIG. 1. Combining circuit 110-0 receives partial match indications PMATCH-00 and PMATCH-m0, and generates complete match indication CMATCH-0. Combining circuit 110-n receives partial match indications PMATCH-0n and PMATCH-mn, and generates a complete match value MATCHn.

It is understood that while the illustration of FIG. 1 shows a combining circuit block 108 that combines pairs of partial match indications, as will be described below, larger numbers of partial match lines can be combined directly and/or indirectly to generate a complete match indication. As just one example, the first and other match line sets (106-00 to 106mn) can include $2^x$ match lines, where x is an integer.

It is also understood that while circuit blocks (102 and 104) are illustrated as physically separate device structures, such blocks could be formed by an essentially logical separation of a single structure. As just one example, a single CAM cell array can include different sets of match lines and different sets of comparand value lines, each set of match lines corresponding to a different circuit block.

It is further noted that the complete match indications (CMATCH-0 to CMATCH-n) can be provided as inputs to another circuit that can generate indexed data values therefrom. Such circuits can include, without limitation, a priority encoder circuit and/or a read-only-memory and/or a random access memory.

It is also noted that a preferred first embodiment can be formed on a single integrated circuit substrate. Such an integrated arrangement can allow for faster access speeds.

Figure 2:
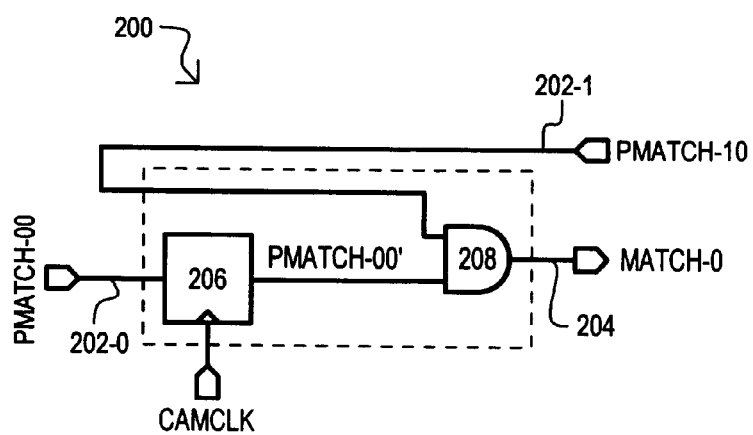
FIG. 2 is a schematic diagram of a combining circuit that may be used in the first embodiment.

Referring now to FIG. 2, a schematic diagram is set forth illustrating a first example of a combining circuit that may be used in the first embodiment 100. The combining circuit of FIG. 2 is designated by the general reference character 200, and can combine a first partial match indication PMATCH-00 with a second partial match indication PMATCH-10 and generate a complete match value MATCH-0. First partial match signal PMATCH-00 can be received at a first combining input 202-0, the second partial match signal PMATCH-10 can be received at a second combining input 202-1, and the output signal MATCH-0 can be provided at a combining output 204.

The combining circuit 200 further includes a latch 206 and a logic gate 208. The latch 206 can receive an input signal, and then provide the signal as an output after a predetermined delay. In FIG. 2, the latch can receive the PMATCH-00 signal an input, and provide a delayed PMATCH-00' signal as an output. The particular latch 206 of FIG. 2 is a clocked latch that can operate according to a clock signal CAMCLK. In particular, the input to the latch 206 can be latched when the CAMCLK transitions from high to low.

Logic gate 208 can logically combine the output of latch 206 with the signal at the second combining input (PMATCH-10). In the particular arrangement illustrated by FIG. 2, the logic gate 208 is a two-input AND gate. Of course, other types of logic circuits could be utilized to indicate the logical combination of the PMATCH-00 and PMATCH-10 signals. The output of logic gate 208 can be a complete match indication MATCH-0.

Figure 3:
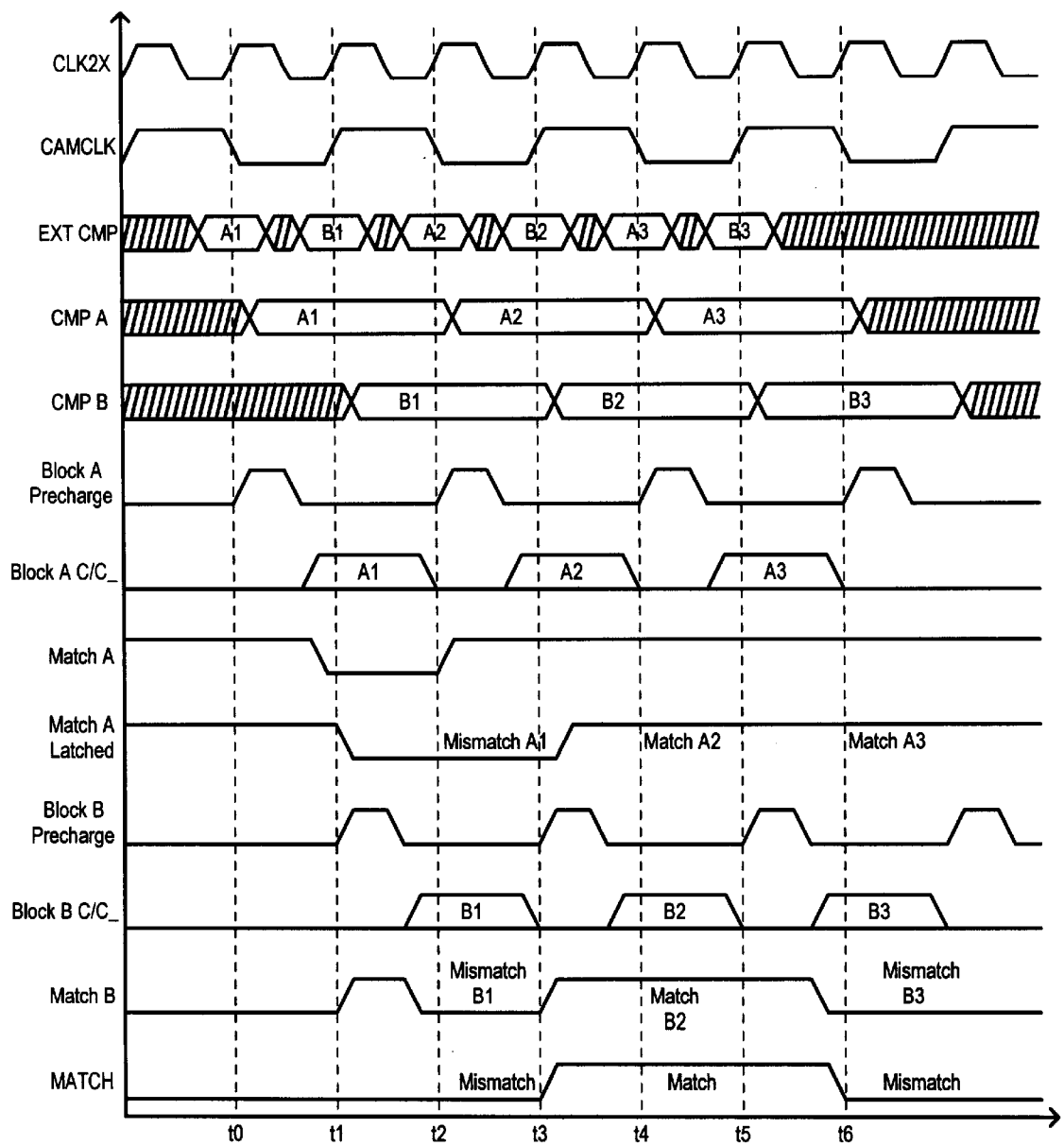
FIG. 3 is a timing diagram illustrating the operation of the first embodiment.

The operation of the first embodiment 100 will now be described in conjunction with a timing diagram set forth in FIG. 3. The timing diagram of FIG. 3 illustrates the operation of a synchronous CAM that can compare a 128-bit comparand value with a 128-bit data values. The 128-bit comparand value can be divided into a most significant 64-bit portion (CMP A) and a least significant 64-bit comparand portion (CMP B). The various 128-bit data values are divided into most significant 64-bit portions stored in first circuit block 102 and least significant 64-bit portions stored in other circuit block 104.

Set forth in FIG. 3 is a CLK2X waveform. The CLK2X signal can represent a clock signal having a frequency that is higher than a system clock frequency. A system clock signal can be a timing signal applied to a CAM device from an external source. For example, the CLK2X signal can have a frequency that is some multiple of a system clock signal. In the example of FIG. 3, the CLK2X signal is assumed to be running at twice a system clock frequency. The CLK2X signal may be used to latch comparand value portions.

FIG. 3 also includes a CAMCLK waveform and an EXT CMP waveform. The CAMCLK waveform can represent a system clock signal, or a clock signal that is synchronous with a system clock signal. The EXT CMP waveform can represent how portions of a comparand value are applied to the first embodiment 100. Thus, in FIG. 3, three comparand values are applied in sequence, each including two portions. A first 128-bit comparand value is applied by a 64-bit most significant portion A1 followed by a 64-bit least significant portion B1. Similarly, a second 128-bit comparand value is applied in a first 64-bit portion A2 and second 64-bit portion B2, and a third comparand value is applied as a first 64-bit portion A3 and second 64-bit portion B3.

Waveforms CMP A and CMP B can represent the storing of the comparand value portions within a CAM. CMP A can represent the storing of a first comparand portion within the CAM, while CMP B waveform can represent the storing of a second comparand portion within the CAM.

The next four waveforms, Block A Precharge, Block A C/C_, Match A, and Match A Latched, can illustrate the operation of first block circuit 102. The Block A Precharge waveform can illustrate a precharge operation. Such a precharge operation can precharge match line sets in first circuit block 102 (such as 106-00 to 106-0n) to a predetermined potential. In addition, or alternatively, such a precharge operation can include the predischarge and/or equalization of comparand value lines that can carry a comparand value portion to the first circuit block 102.

The Block A C/C_ waveform can represent the application of a comparand value portion (A1, A2 or A3) to the first circuit block 102. Such an application of a comparand value can include, as just one example, driving complementary comparand values lines to opposing logic values.

The Match A waveform can illustrate the generation of a partial match indication on one or more match lines in the first circuit block 102. Such a partial match indication can indicate a match between a comparand value portion (A1, A2 or A3) and one or more data value portions within the first block circuit 102. It is understood that at this time partial mismatch indications can also be generated. Partial mismatch indications can indicate no match between a comparand value portion (A1, A2 or A3) and a data value portion stored within the first block circuit 102.

The Match A Latched waveform can illustrate the latching of partial match (and/or partial mismatch) indications from the first block circuit 102 within combining circuit block 108.

The Block B Precharge, Block B C/C_, and Match B waveforms can represent corresponding operations in the other circuit block 104.

The MATCH waveform can represent a complete match indication. In the particular arrangement of FIG. 3, the MATCH waveform can indicate a match between both comparand value portions (A1/B1, A2/B2 or A3/B3) and corresponding data value portions in the first circuit block 102 and other circuit block 104.

Referring once again to FIG. 3, at time t0, the first portion A1 of a first comparand value is applied on the falling edge of the CAMCLK signal. This value is then stored in a register, for example, within the CAM. Also at time t0, as shown by the Block A Precharge waveform, the first block portion 102 undergoes a precharge operation.

At about time t1, the second portion B1 of a first comparand value is applied on the rising edge of the CAMCLK signal. The B1 value is also stored in a register, for example, within the CAM. Slightly before time t1, comparand value portion A1 is applied to the first circuit block 102. As shown by the low Match A waveform at about time t1, there are no partial match indications within the first block portion 102 (a mismatch condition exists). As just one example, a mismatch condition can be generated by all of the match lines of the first block portion 102 being discharged (all of the partial match signals being driven low). The mismatch condition can be applied to combining circuit block 108. It is noted that the partial match values of the mismatch condition are not yet latched within latches of the combining circuits (110-0 to 110-n), however the latches have now become transparent, allowing the MATCH A mismatch condition to propagate to Match A Latched.

Also at time t1, as shown by waveform Block B Precharge, the other circuit block 104 can undergo a precharge operation.

At time t2, the CAMCLK signal transitions low. The low-going CAMCLK signal can result in the mismatch indication being latched within combining circuit block 108. In the event the combining circuit block has combining circuits such as those shown in FIG. 2, the high-going CAMCLK signal can result in delayed partial match indications (such as MATCH-00') being applied to logic gate (such as 208).

Also at about time t2, comparand value portion B1 is applied to the other circuit block 104. As shown by the low Match B waveform at about time t2, there are no partial match indications within the other circuit block portion 104 (a partial mismatch condition exists). The partial mismatch indication from the other circuit block portion 104 can be combined with the partial mismatch indication from the first circuit block portion 102 latched in the combining circuit block 108. Such a comparison can generate a complete (mis)match indication at about time t2, or even sooner (about time t1 in this case).

In this way, a compare operation at about time t1, between a partial comparand value (A1) and a number of partial data values, can be combined with a compare operation at time t2, between another partial comparand value (B1) and a number of corresponding partial data values, to generate complete match indication. Further, precharge operations in the circuit block portions (102 and 104) can also be staggered in time, with the first circuit block portion 102 being precharged at about time t0 and the other circuit block portion 104 being precharged at about time t1.

FIG. 3 illustrates two more compare operations that occur in a "pipelined" fashion after the first compare operation. A first portion (A2) of a second comparand value is applied to the CAM at time t2, and a second portion (B2) of the second comparand value is applied to the CAM at time t3.

In the example of FIG. 3, a first compare operation between the comparand portion A2 and partial data values within first circuit block 102 results in match indication. This is shown by the Match A2 portion of waveform "Match A Latched." As just one example, such a match indication can be generated by one or more match lines remaining high after the partial comparand value has been applied. The match indication is latched within combining circuit block 108 at time t4.

Also at time t4, a second compare operation between the comparand portion B2 and partial data values within other circuit block 104 can result in a match indication. This is shown by the Match B2 portion of waveform "Match B."

At about time t4, the match indication from the other circuit block 104 is combined with the match indication from the first circuit block 102. If the match indications correspond to the same data value, the combining circuit block 108 can generate a complete match indication. This is shown by the Match portion of waveform "MATCH." In the event combining circuits such as that set forth in FIG. 2 is employed, partial match indication PMATCH-00 would correspond to partial match indication PMATCH-10. Thus, if both partial match indications indicate a partial match (are high), the MATCH-0 indication will indicate a match (be driven high).

It is noted that a third match operation is also illustrated in FIG. 3. The third match operation includes comparing partial comparand values A3 and B3 to partial data values in the first circuit block 102 and other circuit block 104, respectively. However, unlike the first two compare operations, in the third compare operation, the match lines of one circuit block indicate a match condition while the match lines of another circuit block indicate a mismatch condition. In such a situation, due to the operation of combining circuit block 108, a complete match indication will indicate a mismatch.

In this way, an input comparand value can be segmented into portions, and compared to similarly segmented data values. Match operations between comparand segments and corresponding data value segments can be performed sequentially in time, limiting the peak current transient for the entire match operation. A peak current transient may thus be distributed into two or more smaller current transients.

It is understood that while the above-described examples illustrate the comparison of two comparand portions with corresponding data value portions, such an arrangement should not be construed as limiting the invention thereto. A comparand value can be divided into more than two portions, and then compared with more than two corresponding data value portions. Compare operations can be "staggered" in time to thereby limit current transients. In the event the CAM is a synchronous CAM specified to receive a comparand value every system clock cycle, such multiple compare operations can occur within one system clock cycle.

While the example of FIG. 3 illustrates a CAM having an internal clock signal (CLK2X) that is twice the frequency of a system clock signal, other approaches could utilize internal clock signals having frequencies that are higher multiples of a system clock frequency. In addition, or alternatively, various internal clock signals could be generated from a system clock signal to partition operations within the CAM into segments. Segmented operations can distribute compare and/or precharge operations over a single system clock cycle. Such staggered clocks could be generated by a number of different approaches. To name just a few, self-timed delays can be used to stagger clocks with respect to a system clock, a delay locked loop (DLL) circuit and/or phased lock loop (PLL) can also be used to generate clock signals that are "staggered" in time with respect to a system clock signal and/or one another.

In one particular example, a CAM could segment comparand and data values into four portions, and include four internal clock signals having active edges staggered over a single system clock period. Compare and/or precharge operations within the CAM could be controlled in response to the various internal clock signals. In addition, or alternatively, four portions of a comparand value can be applied in synchronism with the various internal clock signals. Alternatively, a non-segmented comparand value may be applied, and segmented into four portions internally within the CAM. The four portions can then be sequentially applied to corresponding data value portions.

It is also understood that the invention is not necessarily limited to comparing a portion of a comparand value with portions of data values. Non-segmented comparand values can be compared to non-segmented data values. As just one example, the same comparand value can be applied to multiple circuit block portions, with compare operations within the various circuit block portions being staggered in time.

To better understand a "non-segmented" mode of operation, reference will be made to FIG. 1 once again. In a non-segmented mode of operation, the same comparand value can be applied to first circuit block 102 and the other circuit block 104. Thus, CMP A can be the same as CMP B. In such an approach, match indications from both circuit blocks can be provided as individual values by the combining circuit block 108. In addition, or alternatively, a CAM can provide single match indications from first and other circuit blocks (102 and 104) in one mode (operate in a non-segmented mode), and combination match indications in another mode (operate in a segmented mode as described above). Combination match indications can represent the logical combination of one or more match indications from a first circuit block 102 with one or more match indications with another circuit block 104.

Figure 4:
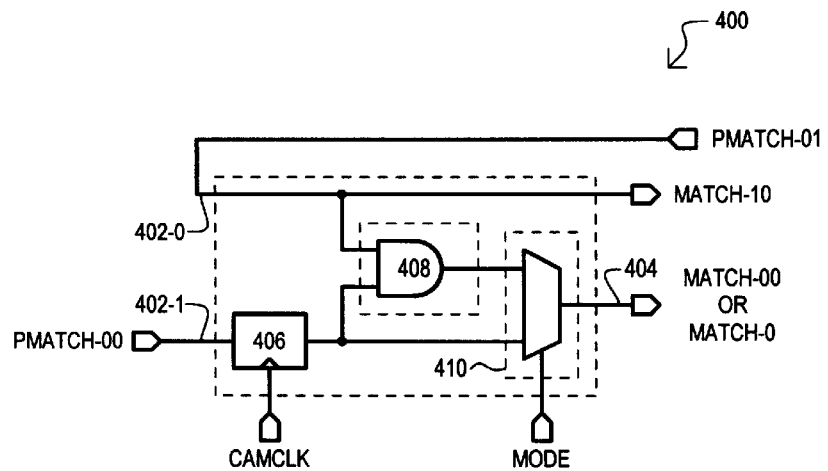
FIG. 4 is a schematic diagram of an alternate combining circuit that may be used in the first embodiment.

Referring now to FIG. 4, a schematic diagram is set forth illustrating an alternate combining circuit that may be used in the first embodiment 100 to provide a segmented mode of operation and a non-segmented mode of operation. The combining circuit is designated by the general reference character 400, and is shown to include combining inputs (402-0 and 402-1), a combining output 404, a latch 406, a logic gate 408, and a multiplexer (MUX) circuit 410.

A MUX circuit 410 can receive combined match indications (logical combinations of match indications from different circuit blocks), and single match indications. According to a mode signal (MODE), the MUX circuit can provide a combined or single match indication as an output. In the particular arrangement of FIG. 4, the MUX circuit 410 can provide single match indications MATCH-00 and MATCH-10 as outputs, or a combined match indication (MATCH-0), where the combined match indication is the logical combination of partial match indications PMATCH-00 and PMATCH-10.

In this way, the MUX circuit 410 can enable a signal path carrying a non-segmented match indication between the latch 406 and combining output 404 in a non-segmented mode, and can enable a signal path carrying a combination match indication between logic gate 408 and combining output 404 in a segmented mode. It is understood that "signal path" could include other logic circuits, such as inverters and/or additional logic gates that enable a signal to propagate between two points (including intermediate and/or final inversions in the logic value of a signal).

In one particular arrangement, the MATCH-00 and MATCH-10 values can represent two compare results between a 64-bit comparand value and 64-bit data values in each circuit block (102 and 104). The MATCH-0 value can provide a single compare result between a segmented 128-bit comparand value and segmented 128-bit data values, each data value having 64-bit portions in first circuit block 102 and corresponding 64-bit portions in the other circuit block 104.

It also noted that while the example of FIG. 3 illustrates the application of comparand portions at different times (e.g., A1 being applied at time t0 and B1 being applied at time t1), a non-segmented comparand value could be stored within a CAM ("clocked in"), and then applied in a segmented fashion to multiple circuit blocks (such as 102 and 104). However, it is understood that the general approach of applying comparand portions, such as that shown in FIG. 3, may be advantageous for systems having limited bus sizes.

While data values may be segmented across multiple circuit block portions (such as 102 and 104), other embodiments of the present invention can include data values that are segmented within circuit block portions. To understand one such arrangement, a second embodiment is set forth in a block schematic diagram in FIG. 5.

Figure 5:
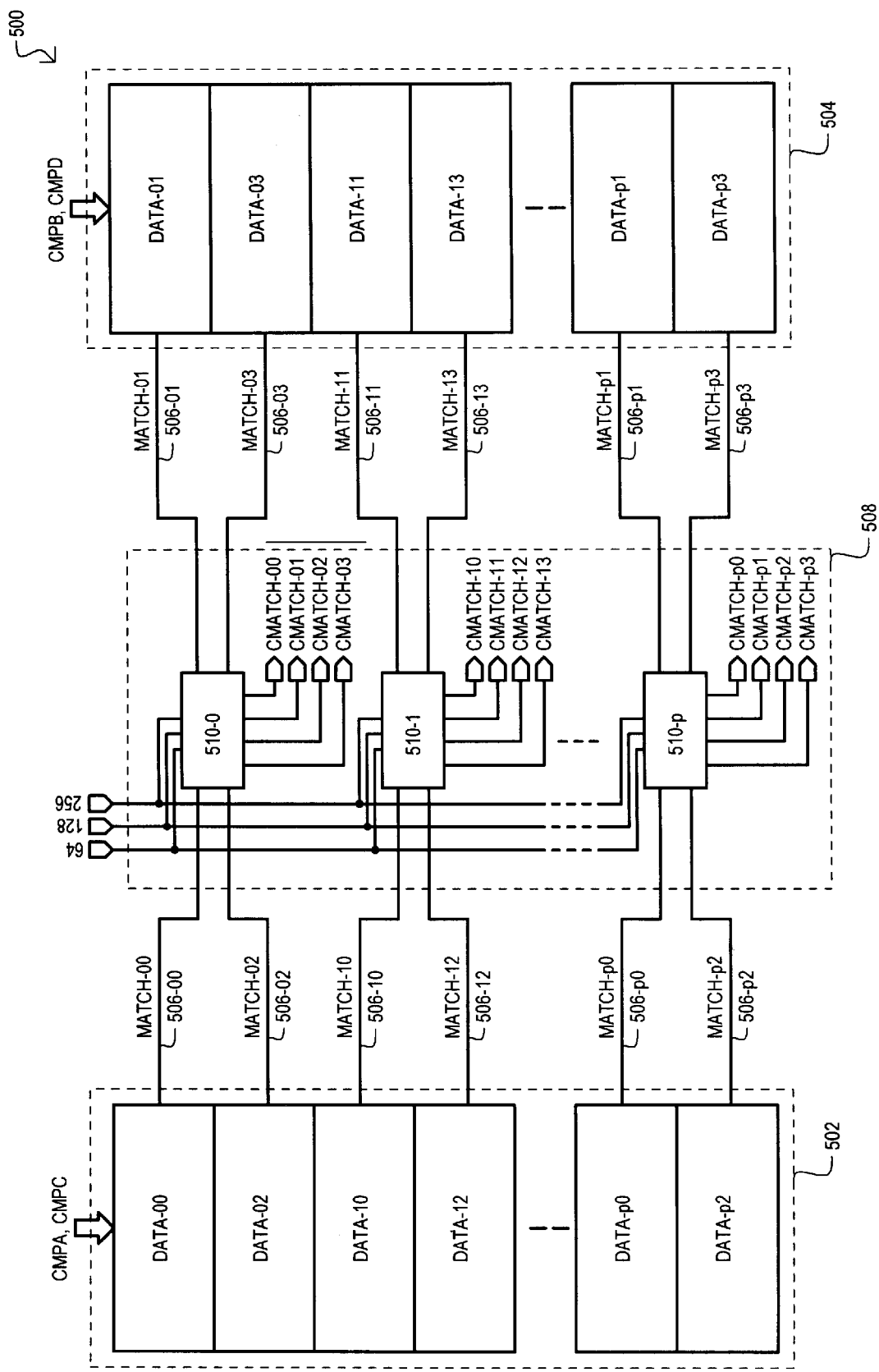
FIG. 5 is a block schematic diagram of a second embodiment.

Referring now to FIG. 5, the second embodiment is designated by the general reference character 500, and is shown to include a first circuit block 502 and another circuit block 504. Various stored data are shown in FIG. 5 as DATA-00 to DATA-p3. As will be described in more detail blow, stored data may correspond to other stored data according to particular mode of operation.

The particular second embodiment 500 of FIG. 5 can have a number of operating modes. One mode can be a non-segmented mode, and include a first comparison of a comparand value to data values in the first circuit block 502, and a second comparison of the same comparand value to data values in the second circuit block 504. The first and second comparisons can be staggered in time (i.e., be substantially not simultaneous). In such an arrangement, the stored data (DATA-00 to DATA-p3) within the first and other circuit blocks (502 and 504) are non-segmented data values. Thus, data values within the first circuit block 502 do not correspond to data values within the other circuit block 504. As one particular example, a 64-bit comparand value can be compared to 64-bit data values in the circuit blocks (502 and 504).

Another mode of operation can be a segmented mode, and include a first compare operation between a comparand segment and data value segments in the first circuit block 502, and a second compare operation between another comparand segment and data value segments in the second circuit block 504. The first and second compare operations can be staggered in time. In such an arrangement, stored data (DATA-00 to DATA-p1) within the first circuit block 502 are data value segments, and stored data (DATA-01 to DATA-p3) within the other circuit block 504 are corresponding data segments. For example, data segment DATA-00 can correspond to data segment DATA-01, as both data segments can form a single data value. As one particular example, the first (more significant) 64-bits of a 128-bit comparand value can be compared with the first 64-bits of 128-bit data values stored within the first circuit block 502. The last (less significant) 64-bits of the 128-bit comparand value can be compared with the last 64-bits of 128-bit data values stored within the other circuit block 504.

Yet another mode of operation can be a segmented mode where data values are segmented within the same circuit block (502 and 504). Each compare function can include four compare operations. A first and third compare operation can compare first and third compare segments with first and third data value segments, while second and fourth compare operations can compare second and fourth compare segments with second and fourth data value segments. The first, second, third and fourth compare operations can be staggered in time. In such an arrangement, stored data (DATA-00 to DATA-p2) within the first circuit block 502 can be data value segments that correspond to one another, and stored data (DATA-01 to DATA-p3) within the other circuit block 504 can be data value segments that correspond to the data value segments of the first block 502.

As one particular example, first circuit block 502 can store the first 64-bits and third 64-bits of a 256-bit data value. The other circuit block 504 can store the second 64-bits and last 64-bits of a 256-bit data value. In one particular arrangement, data value segments DATA-00, DATA-01, DATA-02 and DATA-03 can form a single data value, and data values DATA-10, DATA-11, DATA-12 and DATA-13 can form another data value. Of course, the particular storage pattern of FIG. 5 is illustrative, and should not be construed as limiting the invention thereto.

A first 64-bit comparand portion can then be applied to the first circuit block 502. Resulting partial match indications (which can include match and mismatch indications) corresponding to the first data value segments can be stored. A second 64-bit comparand portion can then be applied to the other circuit block 504. Resulting partial match (or mismatch) indications corresponding to the second data value segments can then be stored. A third 64-bit comparand portion can then be applied to the first circuit block 502. The resulting partial match (or mismatch) indications corresponding to the third data value segments can be stored. A fourth 64-bit comparand portion can then be applied to the other circuit block 504. The resulting partial match (or mismatch) indications can be logically combined with the previously stored partial match (or mismatch) indications to generate complete match indications between a 256-bit comparand value and 256-bit data values.

In the above-described arrangement, match (or mismatch) indications can be generated on match lines 506-00 to 506-p3. Further, such indications can be stored, and according to a particular mode, combined within a combining circuit block 508. The particular combining circuit block 508 of FIG. 5 is shown to include combining circuits 510-0 to 510-p. Each of the combining circuits (510-0 to 510-p) can be coupled to four match lines and receive four mode signals (shown as 64, 128 and 256). In response to these signals, a combining circuit can provide four complete match output values CMATCH-00 to CMATCH-p3.

The complete match outputs values (CMATCH-00 to CMATCH-p3) can represent match indications and/or combinations of match indications according to a particular mode. As just one of the many possible examples, in a non-segmented mode, each complete match output value (CMATCH-00 to CMATCH-p3) can correspond to match (or mismatch) indication for a 64-bit comparand value and a particular 64-bit data value. In one segmented mode, two of the four complete match output values (CMATCH-00 to CMATCH-p3) can correspond to match (or mismatch) indications for a 128-bit comparand value and particular 128-bit data values split between the circuit blocks (502 and 504). In another segmented mode, one of the four complete match output values (CMATCH-00 to CMATCH-p3) can correspond to match (or mismatch) indication between a 256-bit comparand value and particular 256-bit data value segmented between the circuit blocks (502 and 504).

Figure 6:
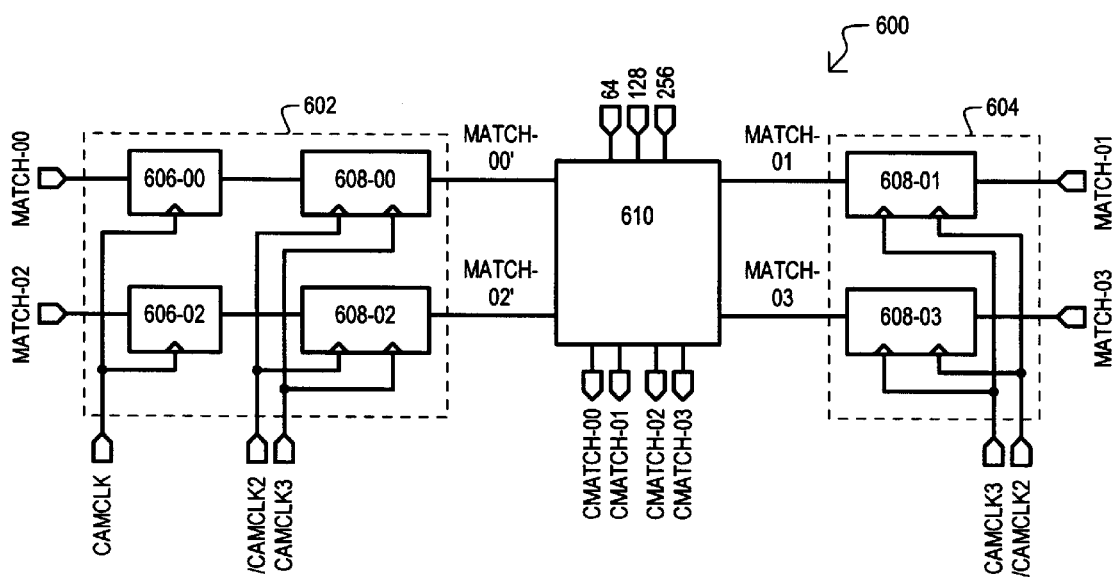
FIG. 6 is a schematic diagram of a combining circuit that may be used in the second embodiment.

Referring now to FIG. 6, a combining circuit that may be used in the second embodiment 500 is set forth in a schematic diagram. The combining circuit is designated by the general reference character 600, and is shown to include a first timing section 602 and another timing section 604. The first timing section 602 can receive match indications MATCH-00 and MATCH-02 generated from one circuit block, and delay them so that they may be combined with match indications from another circuit block (MATCH-01 and MATCH-03). The other timing section 604 can provide the match indications from the other circuit block.

In the particular arrangement of FIG. 6, the first timing section 604 can include a latch circuit 606-00 and 606-02 associated with each match indication. In particular, latch circuit 606-00 is associated with match indication MATCH-00 and latch circuit 606-02 is associated with match indication MATCH-02. The latch circuits (606-00 and 606-02) can be controlled by timing signal(s) CAMCLK. In accordance with the CAMCLK signal(s), match indications MATCH-00 and MATCH-02 are latched and provided to corresponding register circuits 608-00 and 608-02.

Register circuits 608-00 and 608-02 can allow sequential match indications from a first circuit block to propagate through the first timing section 602 without disturbing one another ("pipelining" match indications).

The other timing section 604 can include two register circuits 608-01 and 608-03, each associated with match indications MATCH-01 and MATCH-03. As in the case of the register circuits (608-00 and 608-02) in the first timing section 604, the register circuits of the other timing section 608-01 and 608-03 allow sequential match indications to propagate through the other timing section 604 with disturbing one another.

It is noted that the other timing section 604 does not include latches (such as 606-00 and 606-02). Accordingly, the delayed match indications MATCH-00' and MATCH-02' will be applied to register circuits 608-00 and 608-02 at the same general time that match indications MATCH-01 and MATCH-03 are applied to register circuits 608-01 and 608-03. In the arrangement of FIG. 6 the timing for the register circuits can be controlled by similar clocking signals, thus, the MATCH-00', MATCH-02', MATCH-01 and MATCH-03 signals can be applied to a MUX section 610 at essentially the same time.

MUX section 610 can receive the match indications (MATCH-00', MATCH-02', MATCH-01 and MATCH-03), and in response to control signals "64", "128" and "256", provide complete match indications (CMATCH-00, CMATCH-02, CMATCH-01 and CMATCH-03). Control signal 64 can indicate a non-segmented mode of operation that can be staggered over time. Control signal 128 can indicate a segmented mode of operation that combines match indications so that CMATCH-00 represents the logical combination of match indications MATCH-00' and MATCH-01, and CMATCH-02 represents the logical combination of MATCH-02' and MATCH-03. Control signal 256 can indicate a segmented mode of operation that combines match indications so that CMATCH-03 represents the logical combination of match indications MATCH-00', MATCH-01, MATCH-02' and MATCH-03.

Figure 7:
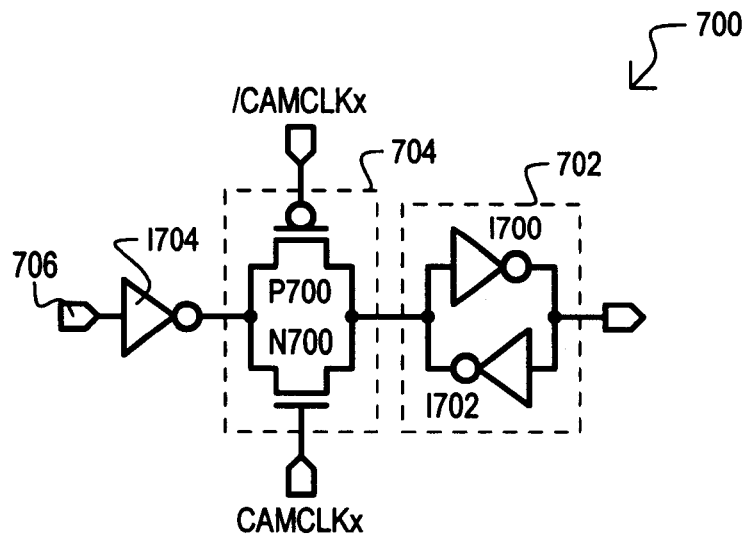
FIG. 7 is a schematic diagram of a latch circuit that may be used in the combining circuit of FIG. 6.

Referring now to FIG. 7, a schematic diagram is set forth illustrating a latch circuit that may be used in the combining circuit of FIG. 6. The latch circuit is designated by the general reference character 700 and is shown to include a latch 702 and a transfer gate 704. The transfer gate 704 can provide a controllable impedance path between an input node 706 and the latch 702 according to a timing signal. When the timing signal is active, a data value at the input node 706 can be coupled to latch 702 by a low impedance path. When the timing signal is inactive, a data value at the input node 706 can isolated from latch 702 by a high impedance path. In this way, when the timing signal is inactive, a match indication can be stored ("latched") in latch 704 and a new timing signal can be applied to the input node 706.

In the particular example of FIG. 7, the transfer gate 704 includes an n-channel insulated gate field effect (referred herein as "NMOS") transistor N700 having a source-drain path arranged in parallel with a p-channel insulated gate field effect (referred to herein as PMOS) transistor. The gates of the transistors N700 and P700 can receive essentially complementary timing signals (CAMCLKx and /CAMCLKx). Of course, the transfer gate 704 can assume a variety of other forms, including just one transistor, as but one example.

In the particular example of FIG. 7, the latch 702 is a "static latch" formed by cross-coupled inverters 1700 and 1702. Of course, other storage circuits can be utilized as a latch.

The latch of FIG. 7 can also include an input inverter 1704. The input inverter 1704 can serve to buffer a match indication signal and/or provide a desired polarity for a match indication signal.

Figure 8:
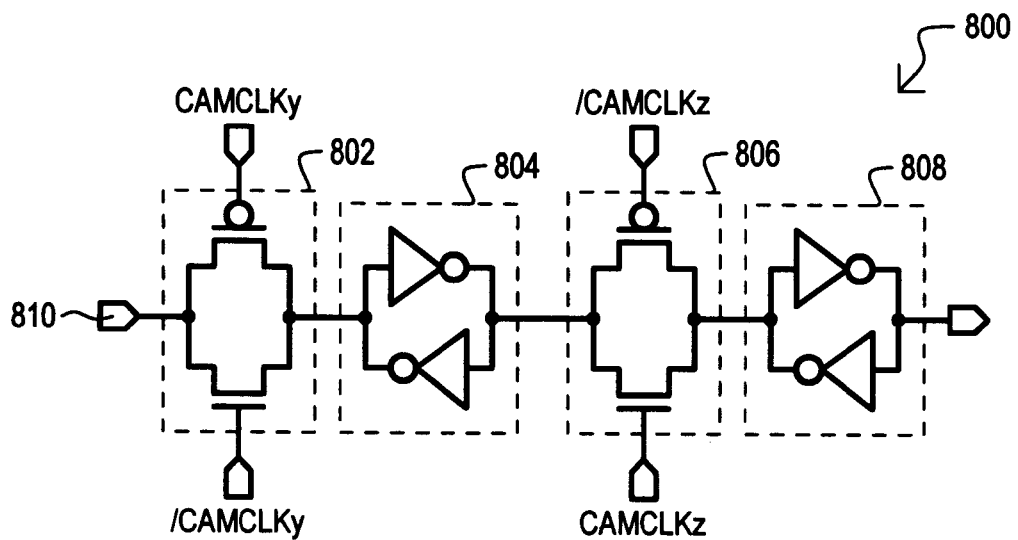
FIG. 8 is a schematic diagram of a register circuit that may be used in the combining circuit of FIG. 6

Referring now to FIG. 8, a register circuit is set forth that may be used in the combining circuit 600 of FIG. 6. The register circuit is designated by the general reference character 800 and includes a first transfer gate 802, a first latch 804, a second transfer gate 806, and a second latch 808. The first and second transfer gates (802 and 806) are controlled by complementary timing signals /CAMCLKy-CAMCLKy and CAMCLKz-/CAMCLKz. In operation, first transfer gate 802 can be turned on, allowing a match indication at input node 810 to be stored in first latch 804. First transfer gate 802 can then be turned off, and second transfer gate 806 can then be turned on, allowing the match indication in first latch 804 to be stored in second latch 808. Second transfer gate 806 can be turned off and first transfer gate 802 can be turned on, allowing a new match indication to be stored in first latch 804.

Figure 9:
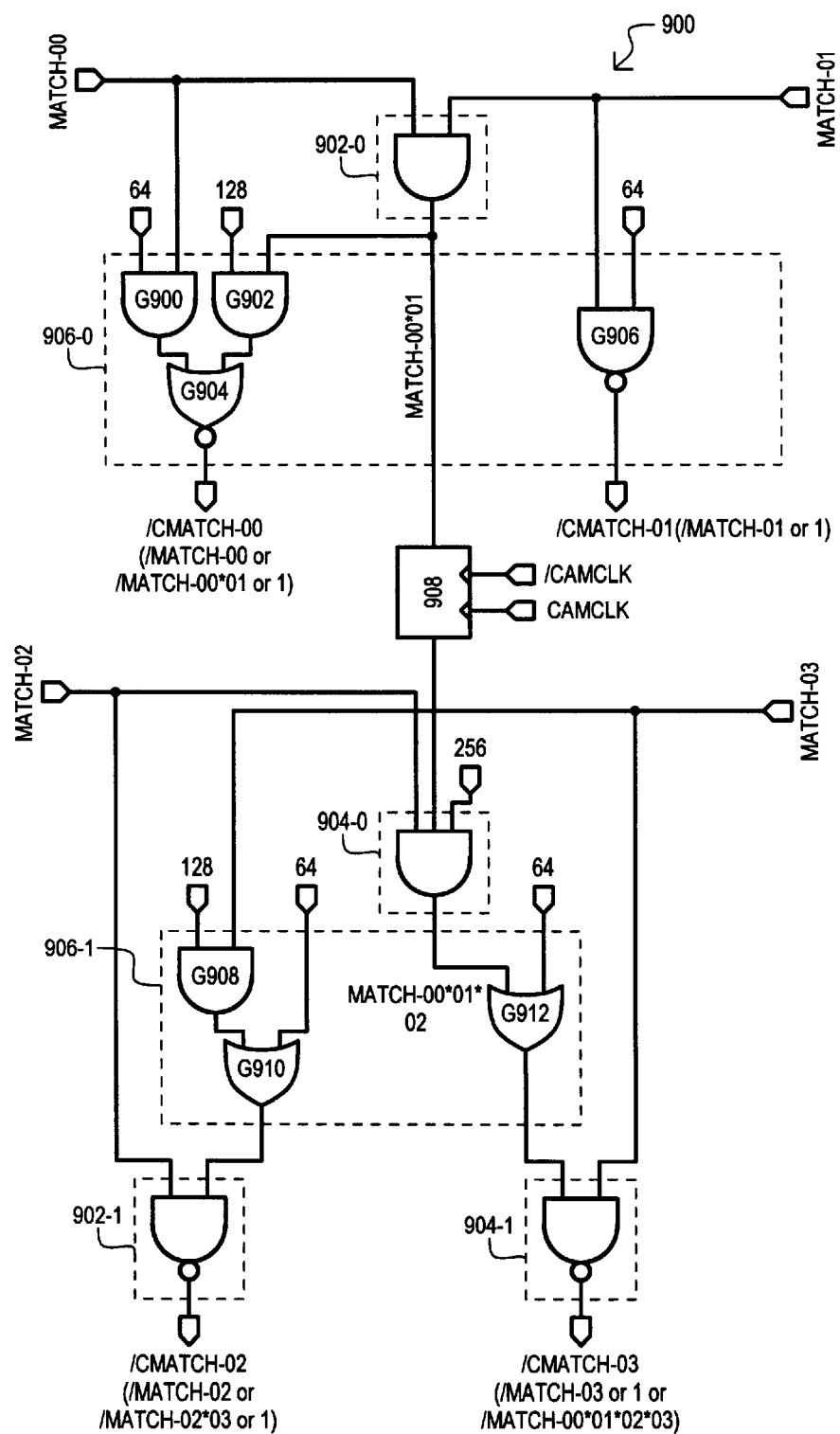
FIG. 9 is a schematic diagram of a multiplexer (MUX) section that may be used in the combining circuit of FIG. 6.

Referring now to FIG. 9, a schematic diagram is set forth illustrating a MUX section that may be used in the combining circuit of FIG. 6. The MUX section is designated by the general reference character 900, and is shown to include first level logic combining circuits 902-0 and 902-1 and higher level logic combining circuits 904-0 and 904-1. First level logic combining circuits (902-0 and 902-1) can logically combine two match indications. For example, first level logic combining circuit 902-0 can include an AND gate that logically ANDs the MATCH-00 and MATCH-01 indications to generate a combination indication MATCH-00*01. First level logic combining circuit 902-1 can include a NAND gate that logically NANDs the MATCH-02 and MATCH-03 indications to generate another combination indication MATCH-02*03.

Higher level logic combining circuits (904-0 and 904-1) can logically combine more match indications than the first level logic combining circuits (902-0 and 902-1). For example, higher level logic combining circuit 904-0 can include an AND gate that logically ANDs the MATCH-02 indication with combination indication MATCH-00*01 to generate a higher combination indication MATCH-00*01*02. Higher level combining circuit 904-1 can include a NAND gate that logically NANDs the MATCH-03 indication with the higher combination indication MATCH-00*01*02 to generate combination indication MATCH-00*01*02*03.

In this way, a MUX section 900 can include first level logic circuits (902-0 and 902-1) that provide a "lower" level of signal combinations. In the particular case of FIG. 9, the lower level logic circuits can combine two match indications. Higher level logic circuits (904-0 and 904-1) can combine a larger number of match indications than lower level logic circuits. In the particular case of FIG. 9, higher level logic circuits can combine three and four match indications.

The MUX section 900 can further include selection circuits 906-0 and 906-1. Selection circuits (906-0 and 906-1) can select between match indications and combination indications according to mode signals 64, 128 and 256. It is assumed that only one of the mode signals will be active (high in the particular case of FIG. 9) at a given time.

Selection circuit 906-0 is shown to include an AND-NOR gate combination that includes AND gates G900 and G902, and NOR gate G904. In the particular arrangement of FIG. 9, when mode signal 64 is active, an inverse MATCH-00 signal can be provided as the /CMATCH-00 output value. When the mode signal 128 is active, an inverse of the combination indication MATCH-00*01 can be provided as the /CMATCH-00 output value. When both the 64 and 128 mode signals are inactive, the /CMATCH-00 output value can be forced to a default value (logic high in this particular case). Selection circuit 906-0 further includes a NAND gate G906. When the mode signal 64 is active, an inverse MATCH-01 signal can be provided as the /CMATCH-01 output value. For other modes (i.e., mode signal 64 inactive) the /CMATCH-00 output value can be forced to a default value (logic high in this particular case).

Selection circuit 906-1 is shown to include an AND gate G908 and an OR gate G910. When the mode signal 128 is active, gate G910 can provide match indication MATCH-03 as an input to first level logic combining circuit 902-1. When the mode signal 64 is active, an enabling default logic value (high in this particular case) can be provided as an input to first level logic combining circuit 902-1. The enabling default logic value can allow the first level logic combining circuit 902-1 to pass on an inverse MATCH-02 value as an output. When both the 64 and 128 mode signals are inactive, a disabling default logic value (low in this particular case) can be provided as an input to first level logic combining circuit 902-1. The disabling default logic value can force the first level logic combining circuit 902-1 to output a default logic value (high in this particular case).

Selection circuit 906-1 further includes an OR gate G912. When mode signal 256 is active, a combination indication MATCH-00*01*02 can be provided to higher level logic combining circuit 904-1. When mode signal 64 is active, an enabling default logic value (high in this particular case) can be provided as an input to higher level logic combining circuit 904-1. The enabling default logic value can enable the higher level logic combining circuit 904-1 (allow it to pass on an inverse MATCH-03 value as an output). When mode signals 64 and 256 are inactive, a disabling default logic value (low in this particular case) can be provided as an input to higher level logic combining circuit 904-1. The disabling default logic value can force the higher level logic combining circuit 904-1 to output a default logic value (high in this particular case).

Selection circuits 902-0 and 902-1 can illustrate how the particular order of logic combining circuits and selection circuits should not be construed as limiting the invention. In selection circuit 902-0, logic combining circuits can be placed prior to selection circuits, while in selection circuit 902-1, logic combining circuits can be placed prior to and/or subsequent to selection circuits. It is also understood that many variations of logic circuits could be utilized to provide an equivalent function to the circuit set forth in FIG. 9.

FIG. 9 further includes a register circuit 908. Register circuit 908 can delay a combination indication MATCH-00*01 generated by one compare operation, and thereby allow it to be logically combined with match indications (MATCH-02 and MATCH-03) generated by a subsequent compare operation. The register circuit 908, as but one example, can have the same configuration as the register circuit 800 set forth in FIG. 8.

Figure 10A:
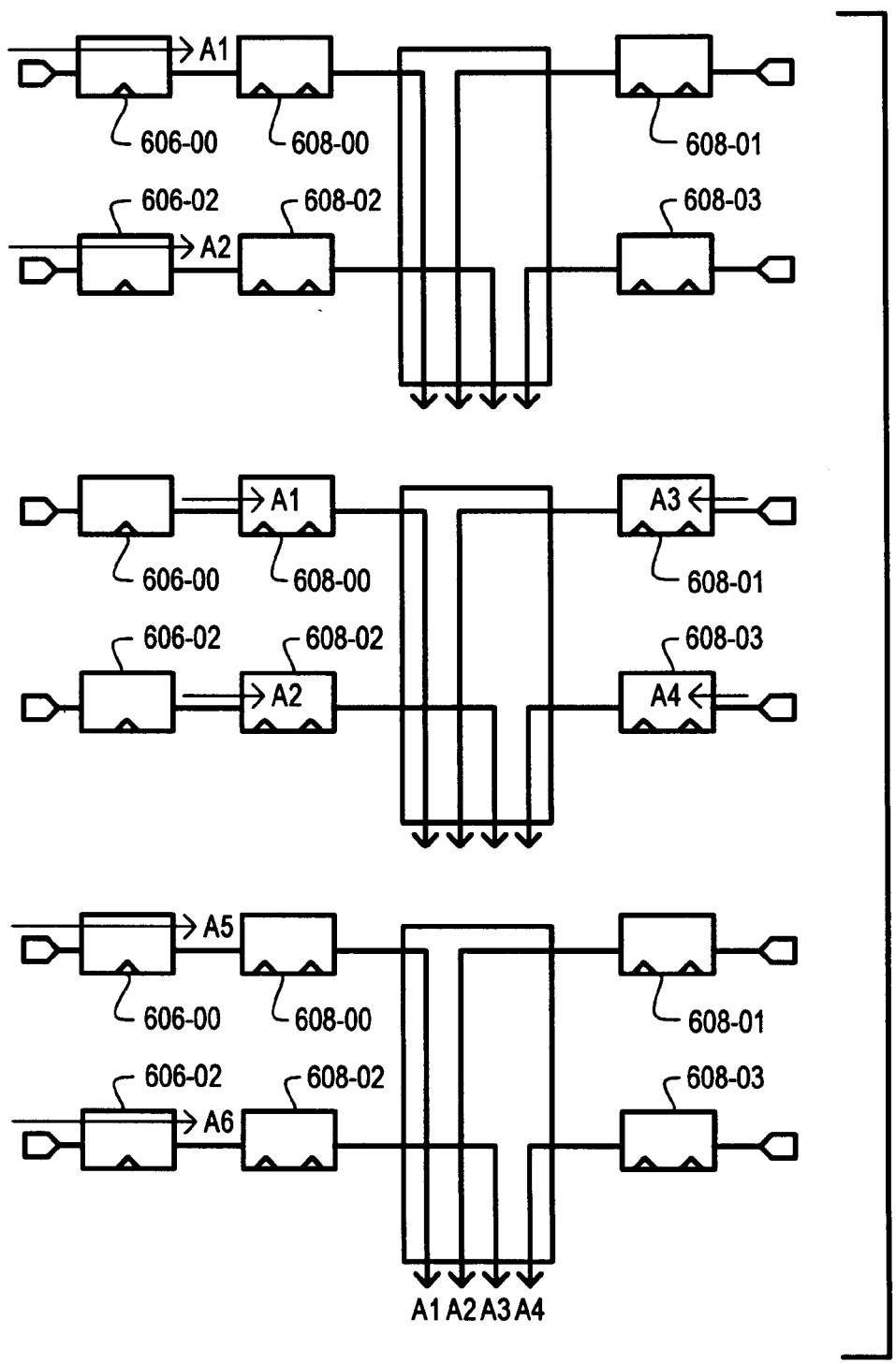
FIGS. 10A, 10B and 10C are operational diagrams of the second embodiment.
Figure 10B:
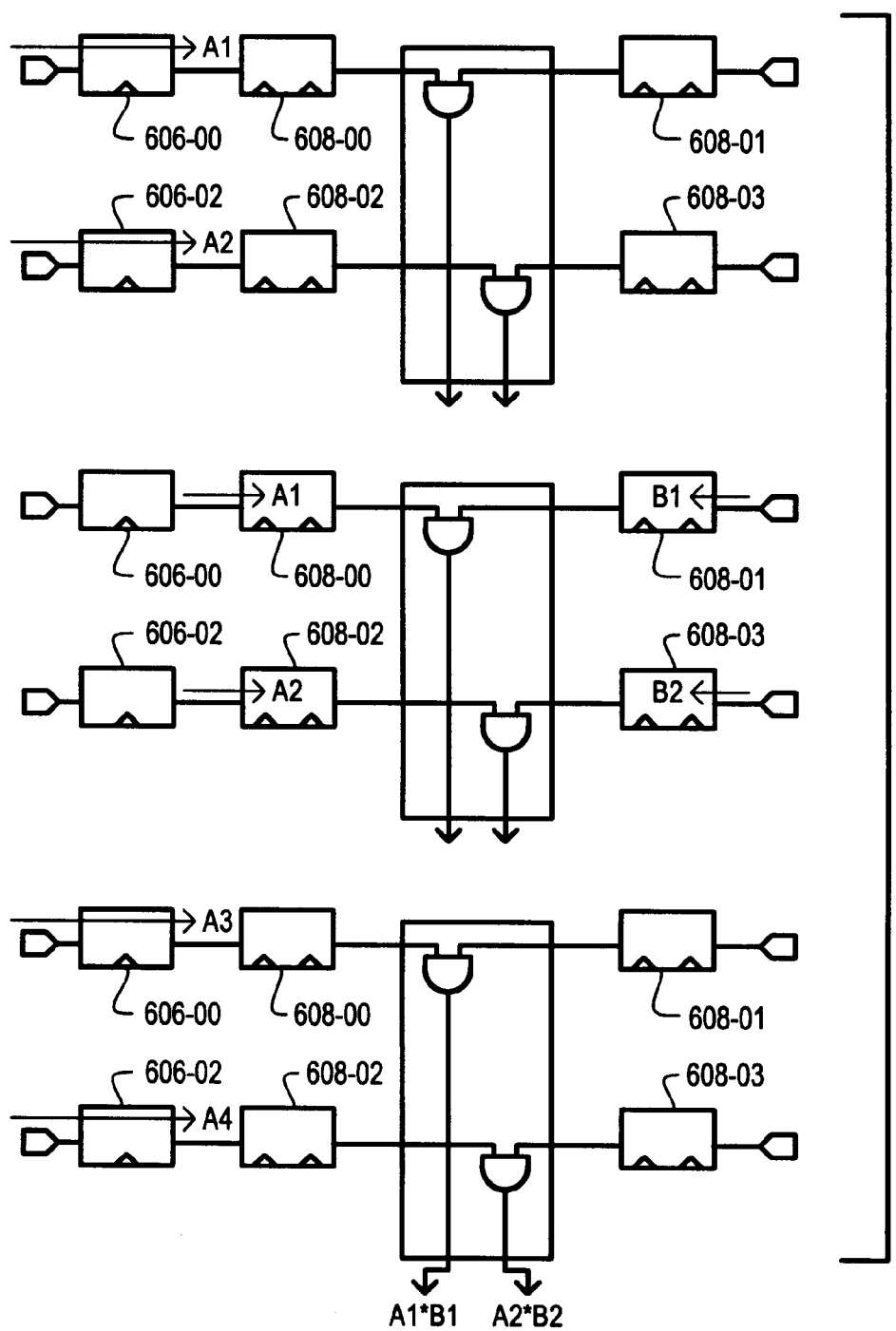
Figure 10C:
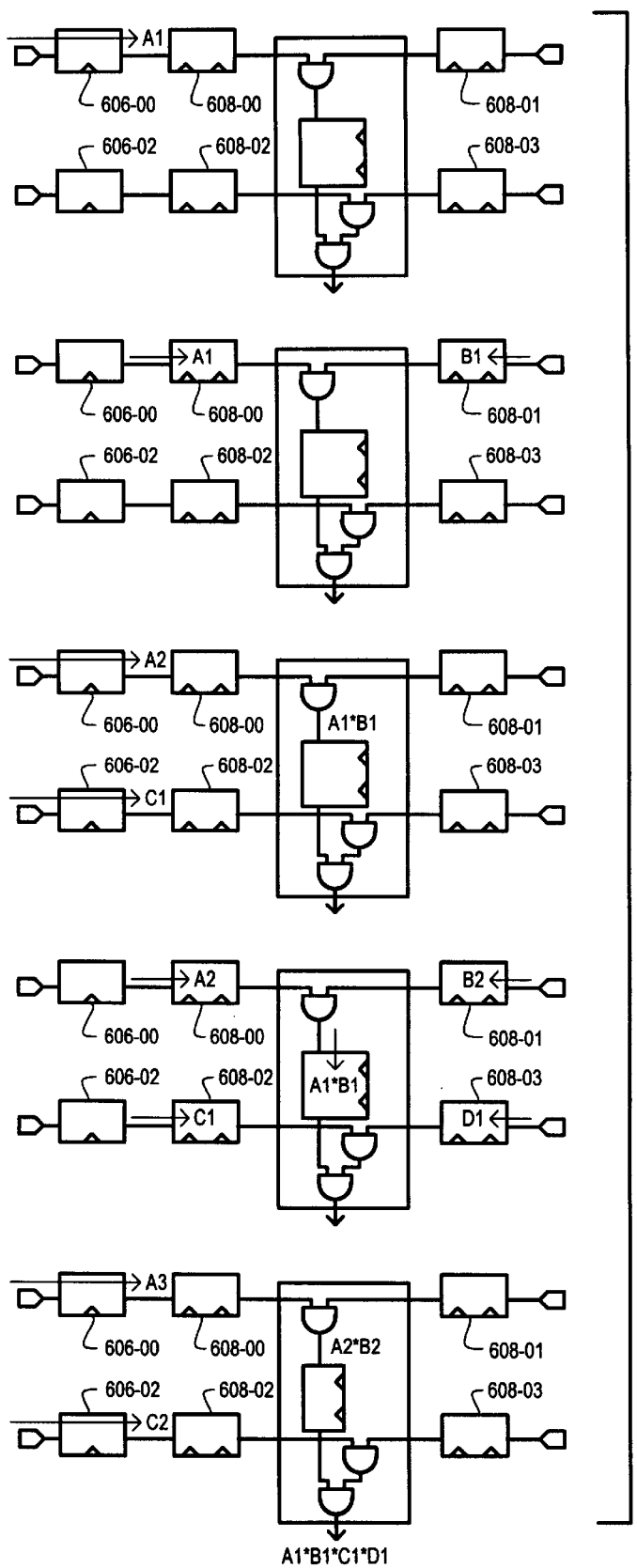

To better understand the operation of the second embodiment 600, an operational timing diagram is set forth in FIGS. 10A, 10B and 10C. Each of FIGS. 10A–10C illustrates latches 606-00 and 606-02, registers 608-00 to 608-03, and MUX section 610 on consecutive CAMCLK half cycles. The propagation paths of various values are illustrated by arrows. The MUX section 610 of each figure varies according to the mode of operation.

FIG. 10A illustrates a non-segmented mode in which values A1–A6 indicate match indications between 64-bit values.

FIG. 10B illustrates a segmented mode in which values A1 and A2 indicate match indications between the first 64-bits of a 128-bit comparand value and 128-bit data values. Values B1 and B2 indicate corresponding match indications between the second 64-bits of a 128-bit comparand value and 128-bit data values.

FIG. 10C illustrates a segmented mode in which values A1, B1, C1 and D1 indicate match indications between the first, second, third and fourth 64-bits of a 256-bit comparand value with the first, second, third and fourth 64-bits of segmented data values comprising a 256-bit data value.

While the described embodiments can reduce peak current transients by staggering compare operations across a clock cycle, the various embodiments may also reduce overall current consumption. According to one embodiment, if a CAM is operating in segmented mode, a mismatch indication that occurs on one compare operation may be used to disable subsequent precharge and/or compare operations on subsequent compare operations. Such an arrangement can occur because if a portion of a data value does not match corresponding comparand bits, it may not be necessary to compare the remaining portions of the comparand to the remaining data value portions.

Figure 11A:
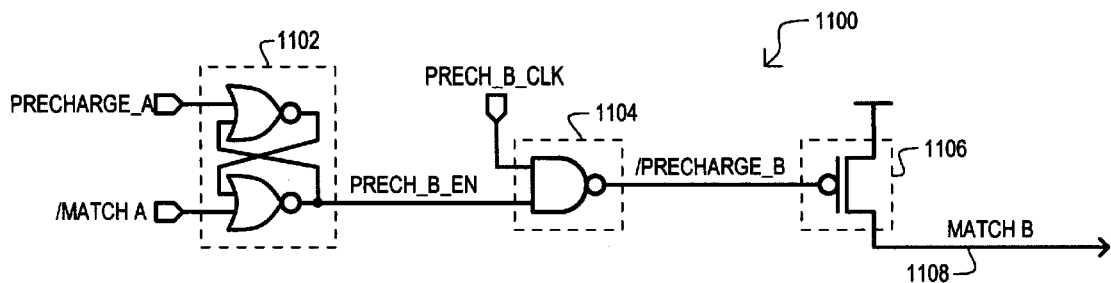
FIGS. 11A and 11B is a schematic diagram of a precharge disable circuit according to one embodiment.

Referring now to FIG. 11A, a schematic diagram is set forth illustrating but one of the many possible circuits that can utilize a mismatch indication from one compare operation to disable a precharge operation in a subsequent compare operation. The disable circuit of FIG. 11A is designated by the general reference character 1100, and can receive an inverse match indication (/MATCHA) and a precharge signal (PRECHARGE_A) from a first circuit block, and can control a precharge signal (PRECHARGE_B) for another circuit block.

The particular disable circuit 1100 of FIG. 11, can include a mismatch state indicator 1102, a precharge signal generator 1104, and a precharge circuit 1106. The mismatch state indicator 1102 can initially provide an enabling (logic high in this example) output signal PRECH_B_EN. The mismatch state indicator 1102 can monitor one or more match indications /MATCHA. Provided the match indication(s) indicate a match condition (/MATCHA low), the enabling output signal PRECH_B_EN will remain high. A high PRECH_B_EN signal can enable precharge signal generator 1104, allowing a precharge signal /PRECHARGE_B to be generated in response to a precharge clock signal PRECH_B_CLK.

If a mismatch indication is generated (/MATCHA high), the PRECH_B_EN output is driven to a disabling logic level (low in this example). A low PRECH_B_EN signal can disable precharge signal generator 1104, preventing the precharge signal /PRECHARGE_B from being generated.

The precharge circuit 1106 can precharge a match line 1108 in response to an active (low) /PRECHARGE_B signal. As just one example, when activated, a precharge circuit 1106 can provide a relatively low impedance path that enables a match line to be precharged in a predetermined amount of time. When inactive, a precharge circuit 1106 can provide a relatively high impedance path that enables a match line to be discharged in match a operation.

Figure 11B:
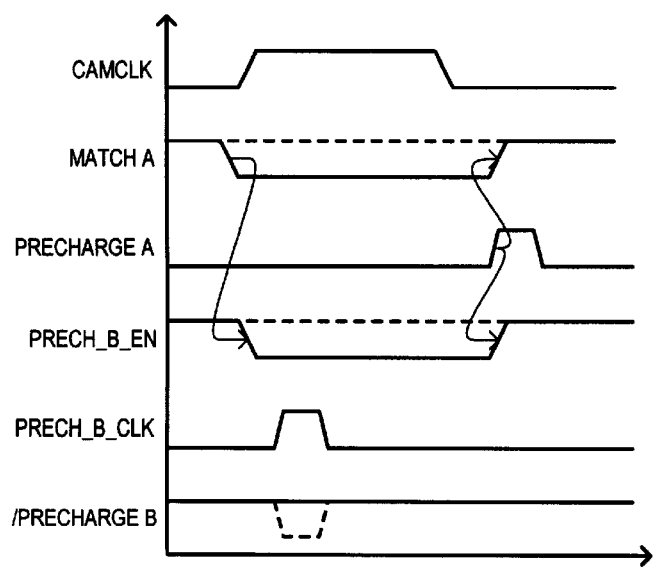
Figure 12:
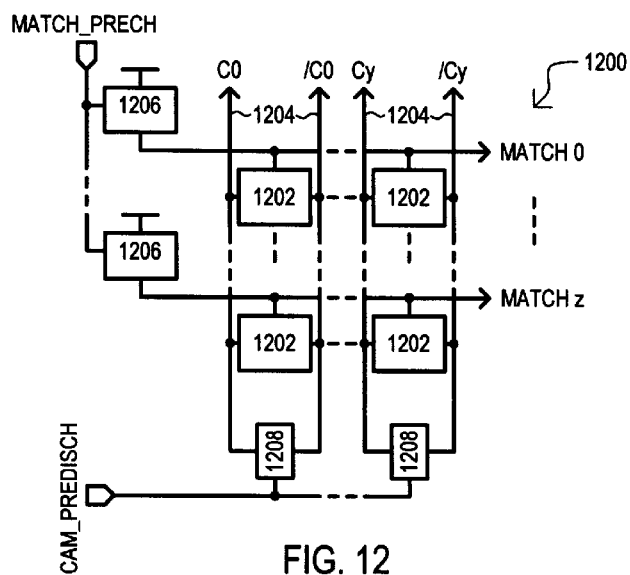
FIG. 12 is a block diagram of a conventional CAM.

FIG. 11B is a timing diagram illustrating the operation of the disable circuit of FIG. 11A. The dashed portions of the various waveforms indicate an operation where a precharge operation is not disabled.

It is understood that while FIGS. 11A and 11B illustrate the disabling of match line precharge operations, like arrangements can be used to disable other aspects of a compare operation, such as compare line precharge, predischarge and/or equalization or compare value sense amplifier activation, to name but two examples.

It is also understood that in another embodiment, a CAM which supports both segmented and non-segmented compare operations, as determined by mode signal(s), could utilize the current saving approaches taught by the invention. One of the many possible current saving implementations is depicted in FIG. 11A. Such a variation can include altering the mismatch state indicator 1102 such that a mode select signal can force PRECH_B_EN active (high) when a non-segmented mode is selected.

It is noted that while the various embodiments have illustrated CAMs that are timed according to synchronous clock signals, one skilled in the art would recognize that such controls signals could be "self-timed" off of an initial timing signal and/or particular device condition. Such control signals could also be generated using "asynchronous" techniques and/or "wave pipelining" techniques.

The teachings set forth herein can be utilized in various CAM arrangements, including both binary and ternary CAMs.

Thus, while the preferred embodiments set forth herein have been described in detail, it should be understood that the present invention could be subject various changes, substitutions, and alterations without departing from the spirit and scope of the invention. Accordingly, the present invention is intended to be limited only as defined by the appended claims.

What is claimed is:

1. A content addressable memory (CAM), comprising:
a plurality of first match lines that provide first compare indications;
a plurality of second match lines that provide second compare indications; and
a plurality of combining circuits, each combining circuit including a combining logic circuit that logically combines at least one first compare indication and at least one second compare indication, each combining circuit further includes a delay circuit coupled between a first match line and a combining logic circuit, each delay circuit delaying a first compare indication.

2. The CAM of claim 1, wherein:
each first match line is coupled to a row of CAM cells in a first circuit block; and
each second match line is coupled to a row of CAM cells in a second circuit block.

3. The CAM of claim 1, wherein:
the delay circuit is a latch circuit.

4. The CAM of claim 3, wherein:
the CAM is a synchronous CAM having an internal timing signal that is synchronous with an external timing signal; and
the latch circuit latches its first compare indication according to the internal timing signal.

5. The CAM of claim 1, wherein:
each combining circuit further includes a multiplexer (MUX) circuit having
a first MUX input coupled to a first match line,
a second MUX input coupled to a combining logic circuit,
a MUX output,
a first signal path between the first MUX input and MUX output that is enabled in a non-segmented mode, and
a second signal path between the second MUX input and MUX output that is enabled in a segmented mode.

6. The CAM of claim 1, wherein:
each combining circuit includes a higher level combining logic circuit coupled to a plurality of first match lines and second match lines, the higher level combining circuit logically combining a plurality of first compare indications and a plurality of second compare indications.

7. A content addressable memory (CAM), comprising:
a plurality of compare indication output lines;
a first circuit block having a plurality of first match lines, the first match lines providing a match indication between a comparand value and corresponding data values in a non-segmented mode and first partial match indications between a first comparand portion and corresponding data value portions in a first segmented mode;
a second circuit block having a plurality of second match lines, the second match lines providing a match indication between the comparand value and corresponding data values in the non-segmented mode and second partial match indications between a second comparand portion and corresponding data value portions in the first segmented mode;
a plurality of store circuits, each store circuit having a store input coupled to at least one first match line and a store output; and
a plurality of lower level logic circuits, each lower level logic circuit being associated with a store circuit and having a first circuit input, second circuit input and a circuit output, each first circuit input being coupled to the store output of its associated store circuit, each second circuit input being coupled to a second match line, and each circuit output being coupled to a selected compare indication output in the first segmented mode.

8. The CAM of claim 7, wherein:
the store circuits are clocked latches that store data values in response to a first clock signal.

9. The CAM of claim 8, wherein:
each store output is coupled to an associated lower level logic circuit by a register circuit;
each second match line is coupled to an associated lower level logic circuit by a register circuit; and
each register circuit including at least one register latch that stores data values in response to a second clock signal, the second clock signal being inactive with the first clock signal is active and being active when the first clock signal is inactive.

10. The CAM of claim 7, further including:
a plurality of selection circuits, at least one selection circuit including
a segmented mode signal input,
a first select input coupled to at least one lower level logic circuit
a second select input coupled to a match line,
a select output, and
a first select signal path between the first select input and the select output that is enabled according to the potential at the segmented mode signal input.

11. The CAM of claim 7, further including:
the first match lines providing at least two partial match indications between first and third comparand portions and corresponding first and third data value portions in a second segmented mode;
the second match lines providing at least two partial match indications between second and fourth comparand portions and corresponding second and fourth data value portions in the second segmented mode; and
a plurality of higher level logic circuits, each higher level logic circuit being associated with a plurality of store circuits and having a plurality of higher level circuit inputs and a higher level circuit output, each higher level circuit output providing a logical combination of at least three partial match indications, each higher level circuit output being coupled to a selected compare indication output in the second segmented mode.

12. The CAM of claim 11, further including:
a plurality of delay circuits, each delay circuit having an input coupled to a lower level logic circuit and an output coupled to a higher level logic circuit.

13. A content addressable memory (CAM), comprising:
at least one first match line coupled to a plurality of first CAM cells;
at least one second match line coupled to a plurality of second CAM cells;
a first delay circuit coupled to the first match line; and
a first level logic circuit having inputs coupled to the first delay circuit and the second match line.

14. The CAM of claim 13, wherein:

the at least one first match line includes a plurality of first match lines coupled to an array of first CAM cells; and the at least one second match line includes a plurality of second match lines coupled to an array of second CAM cells.

15. The CAM of claim 13, further including:

the at least one first match line can be driven between a match potential and mismatch potential; and a precharge circuit coupled to each second match line, each precharge circuit including a controllable precharge impedance path between the second match line and a precharge potential, the controllable impedance having a relatively high impedance in response to the first match line transitioning to a mismatch potential.

16. The CAM of claim 13, further including:

at least one third match line coupled to a plurality of CAM cells;

at least one fourth match line coupled to a plurality of CAM cells;

the first level logic circuit provides an output that is the logical combination of a delayed first match line value and a second match line value;

a second delay circuit coupled to the first level logic circuits; and a second level logic circuit coupled to the second delay circuit, the at least one third match line and the at least one fourth match line, the second level logic circuit providing an output that is the logical combination of the first, second, third and fourth match line values.

17. The CAM of claim 16, wherein:

the at least one first and third match lines include a plurality of first and third match lines coupled to an array of first CAM cells; and the at least one second and fourth match lines include a plurality of second and fourth match lines coupled to an array of second CAM cells.

18. The CAM of claim 13, further including:

the CAM includes an internal periodic timing signal;

the first delay circuit is a clocked latch circuit that latches a first match line value in synchronism with a first transition in the internal timing signal;

a first clocked register circuit coupled between the first delay circuit and the first level logic circuit, the first clocked register circuit storing a delayed first match line value from the first delay circuit in synchronism with a second transition in the internal timing signal that is subsequent to the first transition; and a second clocked register circuit coupled between the second match line and the first level logic circuit, the second clocked register circuit storing a second match line value in synchronism with the second transition in the internal timing signal.

19. The CAM of claim 18, further including:

the first and second clocked register circuits output stored values to the first level logic circuit in synchronism with a third transition in the internal timing signal, the third transition being subsequent to the second transition.

\* \* \* \* \*

UNITED STATES PATENT AND TRADEMARK OFFICE
CERTIFICATE OF CORRECTION

PATENT NO. : 6,240,000 B1  Page 1 of 1
APPLICATION NO. : 09/376397
DATED : May 29, 2001
INVENTOR(S) : Stefan P. Sywkyk and Eric Voelkel It is certified that error appears in the above-identified patent and that said Letters Patent is hereby corrected as shown below:

IN THE SPECIFICATION
At column 1, line 26, please replace "Slight1y" with -- Slightly -- so that the corresponding phrase reads -- Slightly before time t1 --.

Starting at column 13, line 36 and ending at column 13, line 37, please replace "1700 and 1702" with -- I700 and I702 -- so that the corresponding phrase reads -- Cross-coupled inverts I700 and I702 --.

At column 13, line 40, please replace both instances of "1704" with -- I704 -- so that the corresponding phrase for each instance reads -- input inverter I704 --.

Signed and Sealed this

Twenty-seventh Day of May, 2008

JON W. DUDAS
*Director of the United States Patent and Trademark Office*